United States Patent
Xiao

(10) Patent No.: US 10,514,562 B2
(45) Date of Patent: Dec. 24, 2019

(54) AMPLIFIER FOR LCD AND LCD

(71) Applicant: SHENZHEN CHINA STAR OPTOELECTRONICS TECHNOLOGY CO., LTD., Shenzhen, Guangdong (CN)

(72) Inventor: Jianfeng Xiao, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 96 days.

(21) Appl. No.: 15/765,464

(22) PCT Filed: Jan. 30, 2018

(86) PCT No.: PCT/CN2018/074624
§ 371 (c)(1),
(2) Date: Apr. 2, 2018

(87) PCT Pub. No.: WO2019/136783
PCT Pub. Date: Jul. 18, 2019

(65) Prior Publication Data
US 2019/0219855 A1    Jul. 18, 2019

(30) Foreign Application Priority Data

Jan. 15, 2018  (CN) .......................... 2018 1 0037153

(51) Int. Cl.
G09G 3/36       (2006.01)
G02F 1/133      (2006.01)
H03F 3/10       (2006.01)

(52) U.S. Cl.
CPC .......... *G02F 1/13306* (2013.01); *G09G 3/36* (2013.01); *H03F 3/10* (2013.01)

(58) Field of Classification Search
CPC ........ G02F 1/13306; G09G 2310/0291; G09G 3/36; G09G 3/3655; H03F 3/10
(Continued)

(56) References Cited

U.S. PATENT DOCUMENTS 9,692,438 B2 *  6/2017 Shi ...................... H03F 3/45475
2008/0180419 A1 *  7/2008 Tung .................... G09G 3/3655
345/204

(Continued)

FOREIGN PATENT DOCUMENTS

CN       1195785      10/1998
CN       2735631      10/2005
(Continued)

*Primary Examiner* — Tony O Davis
(74) *Attorney, Agent, or Firm* — Leong C. Lei

(57) ABSTRACT

The invention provides an amplifier for LCD, comprising: an operational amplification module and an amplitude-limiting module serially connected to the operational amplification module; the operational amplification module comprising: an operational amplifier, a first resistor, a second resistor, a capacitor, a sampling voltage input terminal, a first reference voltage input terminal and a compensation voltage output terminal; the amplitude-limiting module being connected serially between the capacitor and the second resistor, the amplitude-limiting module comprising a first Schottky diode and a second Schottky diode connected in parallel, and a second reference voltage input terminal connected between the first Schottky diode and the second Schottky diode; an anode of the first Schottky diode and a cathode of the second Schottky diode being both connected between the capacitor and the second resistor. The amplifier for LCD of the invention is stable and reliable.

10 Claims, 6 Drawing Sheets

(58) Field of Classification Search
USPC .......................................... 345/94, 204, 690
See application file for complete search history.

(56) References Cited

U.S. PATENT DOCUMENTS

| | | | | |
|---|---|---|---|---|
| 2009/0002306 A1* | 1/2009 | Huang | ................. | G09G 3/3655 |
| | | | | 345/94 |
| 2009/0140802 A1* | 6/2009 | Kitagawa | ............ | H03F 3/45192 |
| | | | | 330/9 |
| 2009/0160882 A1* | 6/2009 | Kiya | .................... | G09G 3/2007 |
| | | | | 345/690 |
| 2009/0273392 A1* | 11/2009 | Korobeynikov | ......... | H03K 5/24 |
| | | | | 327/551 |
| 2015/0222238 A1* | 8/2015 | Lee | ........................ | H03G 3/008 |
| | | | | 341/159 |
| 2019/0219855 A1* | 7/2019 | Xiao | ................... | G02F 1/13306 |
| 2019/0243402 A1* | 8/2019 | Du | ........................... | G05F 1/575 |
| 2019/0253070 A1* | 8/2019 | Lee | ...................... | H03M 3/362 |

FOREIGN PATENT DOCUMENTS

| | | |
|---|---|---|
| CN | 201780304 | 3/2011 |
| CN | 102842295 | 12/2012 |
| CN | 103117050 | 5/2013 |
| CN | 105118468 | 12/2015 |
| CN | 105353287 | 2/2016 |
| CN | 107174246 | 9/2017 |
| CN | 108172190 | 6/2018 |
| KR | 20070014535 | 2/2007 |

* cited by examiner

AMPLIFIER FOR LCD AND LCD

RELATED APPLICATIONS

The present application is a National Phase of International Application Number PCT/CN2018/074624, filed Jan. 30, 2018, and claims the priority of China Application No. 201810037153.1, filed Jan. 15, 2018.

BACKGROUND OF THE INVENTION

1. Field of the Invention

The present invention relates to the field of display techniques, and in particular to an amplifier for LCD able to improve output voltage stability and an LCD.

2. The Related Arts

The liquid crystal display (LCD) panel is applied to various display devices due to the advantages of low power consumption, no radiation and high resolution. As various LCD products based on LCD panel are developed, LCD becomes ubiquitous.

In the related art, the LCD panel uses an operational amplifier to receive a sampling voltage compensated by the LCD panel, and compensates the sampling voltage of the LCD panel through negative feedback of the operational amplifier to form a reverse compensation voltage and transmits the reverse compensation voltage to the LCD panel to achieve the effect of improving crosstalk interference.

However, in the related art as shown in FIG. 1, the amplifier of the LCD panel comprises a sampling voltage input terminal ACOM_FB, a reference voltage input terminal VCOM, a compensation voltage output terminal ACOMM, a capacitor C1, a first resistor R1 and a second resistor R2. The sampling voltage input terminal ACOM_FB is connected to the operational amplifier module 1 through sequentially connected capacitor C1 and second resistor R2. The first resistor R1 is connected between the inverting input terminal OP_B and the output terminal OP_O.

Refer to FIG. 2 and FIG. 3, wherein FIG. 2 is a schematic view showing the voltage at the inverting input terminal of the operational amplifier in the amplifier of the LCD shown in FIG. 1; FIG. 3 is a schematic view showing the voltage at the output terminal of the operational amplifier in the amplifier of the LCD shown in FIG. 1. When playing pictures that seriously affect the sampling voltage, the sampling voltage will fluctuate greatly. Because the sampling voltage peak returned by the liquid crystal display panel is too high, the operational amplifier causes the output current to increase and the reverse compensation voltage to be unstable so that the screen of the LCD panel flickers. In the meantime, the temperature of the operational amplifier will be too high, resulting in burning.

Therefore, it is imperative to provide a novel amplifier for LCD to address the above issue.

SUMMARY OF THE INVENTION

The object of the present invention is to provide an amplifier for LCD, limiting the fluctuation range of the feedback voltage, ensuring the reliability of the operational amplifier and the LCD to improve stability of the LCD playback.

To achieve the above object, the present invention provides an amplifier for LCD, comprising: an operational amplification module and an amplitude-limiting module serially connected to the operational amplification module;

Wherein the operational amplification module comprises: an operational amplifier, a first resistor, a second resistor, a capacitor, a sampling voltage input terminal, a first reference voltage input terminal and a compensation voltage output terminal; the first resistor is connected between an inverting input terminal and an output terminal of the operational amplifier; the sampling voltage input terminal is connected to the inverting input terminal of the operational amplifier through the capacitor and the second resistor, which are sequentially connected, the first reference voltage input terminal is connected to a positive input terminal of the operational amplifier, and the compensation voltage output terminal is connected to the output terminal of the operational amplifier;

the amplitude-limiting module is connected serially between the capacitor and the second resistor, the amplitude-limiting module comprises a first Schottky diode and a second Schottky diode connected in parallel, and a second reference voltage input terminal connected between the first Schottky diode and the second Schottky diode; an anode of the first Schottky diode and a cathode of the second Schottky diode are both connected between the capacitor and the second resistor.

Preferably, the first reference voltage input terminal and the second reference voltage input terminal receive reference voltages from an external circuit.

Preferably, the first reference voltage and the second reference voltage are equal.

Preferably, the reference voltages are 4-10V.

Preferably, the reference voltages are 5-8V.

Preferably, the sampling voltage input terminal obtains a sampling voltage from the LCD, and the compensation voltage output terminal provides reverse compensation voltage to the LCD.

Preferably, the voltage at the inverting input terminal of the operational amplifier is within ±0.4V to limit ripples at the input terminal.

Compared with the related art, the amplifier for LCD of the present invention, under the premise of ensuring that the useful signal in the sampling voltage is preserved and amplified by setting the amplitude-limiting module, filters out the useful fluctuation in the sampling voltage, limits the output current of the operational amplifier, limits the fluctuation range of the compensation voltage, prevents the operational amplifier from burning up due to heat, and makes the playback of the LCD smoother.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 4:
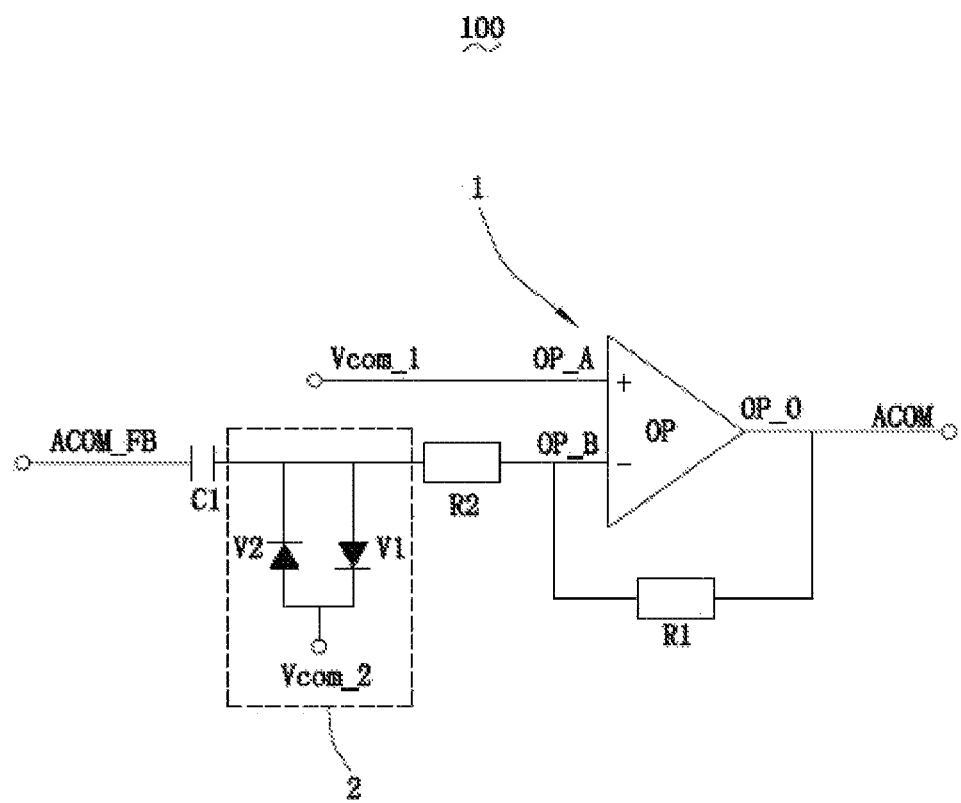
FIG. 4 is a schematic view showing the circuit of the amplifier for LCD according to a preferred embodiment of the present invention.
Figure 5:
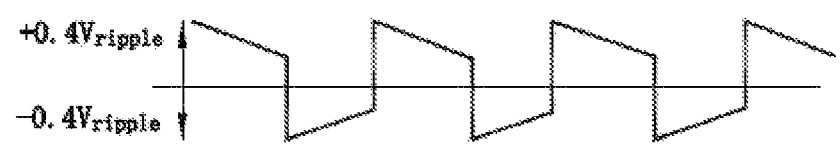
FIG. 5 is a schematic view showing the voltage at the inverting input terminal of the operational amplifier of the amplifier for LCD shown in FIG. 4.
Figure 6:
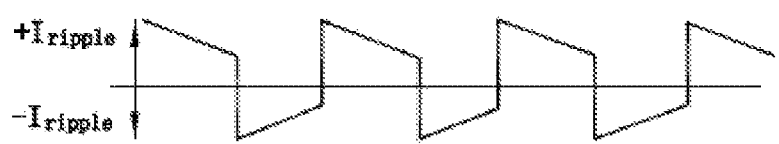
FIG. 6 is a schematic view showing the voltage at the output terminal of the operational amplifier of the amplifier for LCD shown in FIG. 4.

Referring to FIG. 4, the present invention provides an amplifier 100 for LCD, comprising: an operational amplification module 1 and an amplitude-limiting module 2 serially connected to the operational amplification module 1; the operational amplification module 1 comprising: a sampling voltage input terminal ACOM_FB, a first reference voltage input terminal VCOM_1 and a compensation voltage output terminal ACOM, an operational amplifier OP, a capacitor C1, a first resistor R1, and a second resistor R2; the amplitude-limiting module 2 comprising: a second reference voltage input terminal VCOM_2, a first Schottky diode V1, and a second Schottky diode V2.

The operational amplifier OP comprises: a positive input terminal OP_A, an inverting input terminal OP_B, and an output terminal OP_O. The positive input terminal O_A is connected to the first reference voltage input terminal VCOM_1, and the output terminal OP_O is connected to the compensation voltage output terminal ACOM.

The sampling voltage input terminal ACOM_FB is connected to the inverting input terminal OP_B of the operational amplifier OP through sequentially connected capacitor C1 and second resistor R2.

The first resistor R1 is connected between the inverting input terminal OP_B and an output terminal OP_O of the operational amplifier OP.

The first Schottky diode V1 and the second Schottky diode V2 are connected in parallel, and then with one end connected between the capacitor C1 and the first resistor R1, and the other connected to the second reference voltage input terminal VCOM_2. Specifically, the cathode of the first Schottky diode V1 and the anode of the second Schottky diode V2 are both connected to the the second reference voltage input terminal VCOM_2; the anode of the first Schottky diode V1 and the cathode of the second Schottky diode V2 are both connected between the capacitor C1 and the second resistor R2. Of course, the connection direction of the first Schottky diode V1 and the second Schottky diode V2 can be switched to result the same structure.

Specifically, in actual application, the first reference voltage input terminal VCOM_1 and the second reference voltage input terminal VCOM_2 receive reference voltages from an external circuit, and the reference voltage is 4-10V. Specifically, the reference voltage can be 5V, 6V, 7V, or 8V.

The sampling voltage input terminal ACOM_FB is connected to the LCD (not shown), and obtains a sampling voltage from the LCD, and the compensation voltage output terminal provides reverse compensation voltage to the LCD. The useful voltage of the sampling voltage is within ±0.4V. The compensation voltage output terminal ACOM is connected to the LCD, and the sampling voltage is amplified by the amplifier 100 for LCD to form a compensation voltage to flow into the LCD.

Figure 1:
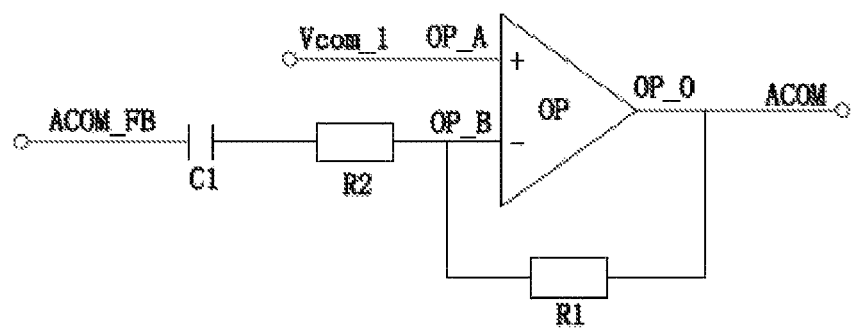
FIG. 1 is a schematic view showing the structure of a amplifier for LCD of prior art.
Figure 2:
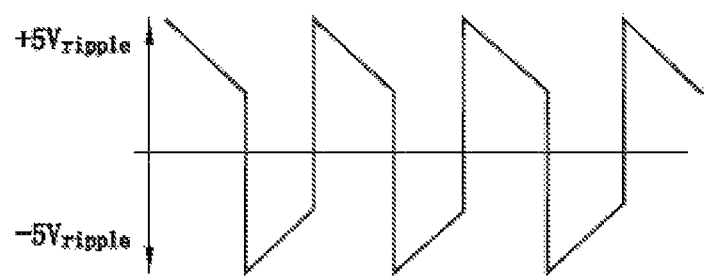
FIG. 2 is a schematic view showing the voltage at the inverting input terminal of the operational amplifier of the amplifier shown in FIG. 1.
Figure 3:
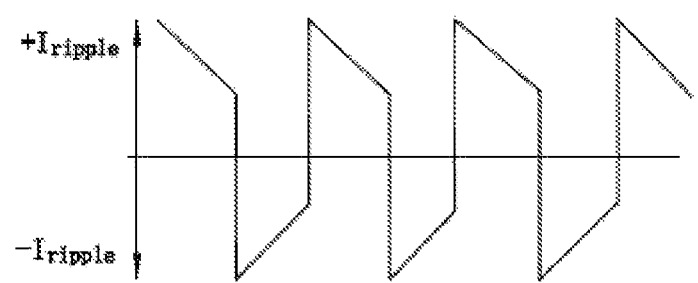
FIG. 3 is a schematic view showing the voltage at the output terminal of the operational amplifier of the amplifier shown in FIG. 1.

Also refer to FIG. 2 for the voltage at the inverting input terminal of the operational amplifier of the amplifier for LCD. When the LCD plays images causing the sampling voltage to fluctuate, the value of the sampling voltage is greatly increased. The first Schottky diode V1 and the second Schottky diode V2 connected in parallel limit the amplitude of the oscillation of the sampling voltage so that the voltage at the inverting input terminal 12 of the operational amplifier OP is limited within ±0.4V to limit the voltage amplitude of the inverting input terminal of the operational amplifier OP so as to suppress the OP output terminal from outputting a large current, which causes the operational amplifier OP to burn out due to heat generation. At the same time, it is possible to stabilize the reverse compensation voltage transmitted to the compensation voltage output terminal ACOM through the output terminal OP_O of the operational amplifier OP, so as to prevent the LCD from flickering and to ensure the stability and smooth playback of the LCD.

Compared with the related art, the amplifier for LCD of the present invention, under the premise of ensuring that the useful signal in the sampling voltage is preserved and amplified by setting the amplitude-limiting module, filters out the useful fluctuation in the sampling voltage, limits the output current of the operational amplifier, limits the fluctuation range of the compensation voltage, prevents the operational amplifier from burning up due to heat, and makes the playback of the LCD smoother.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. An amplifier for liquid crystal display (LCD), comprising: an operational amplification module and an amplitude-limiting module serially connected to the operational amplification module;

wherein the operational amplification module comprises: an operational amplifier, a first resistor, a second resistor, a capacitor, a sampling voltage input terminal, a first reference voltage input terminal and a compensation voltage output terminal; the first resistor is connected between an inverting input terminal and an output terminal of the operational amplifier; the sampling voltage input terminal is connected to the inverting input terminal of the operational amplifier through the capacitor and the second resistor, which are sequentially connected, the first reference voltage input terminal is connected to a positive input terminal of the operational amplifier, and the compensation voltage output terminal is connected to the output terminal of the operational amplifier;

the amplitude-limiting module is connected serially between the capacitor and the second resistor, the amplitude-limiting module comprises a first Schottky diode and a second Schottky diode connected in parallel, and a second reference voltage input terminal connected between the first Schottky diode and the second Schottky diode; an anode of the first Schottky diode and a cathode of the second Schottky diode are both connected between the capacitor and the second resistor.

2. The amplifier for LCD as claimed in claim 1, wherein the first reference voltage input terminal and the second reference voltage input terminal receive reference voltages from an external circuit.

3. The amplifier for LCD as claimed in claim 2, wherein the first reference voltage and the second reference voltage are equal.

4. The amplifier for LCD as claimed in claim 2, wherein the reference voltages are at a range of 4-10V.

5. The amplifier for LCD as claimed in claim 4, wherein the reference voltages are at a range of 5-8V.

6. The amplifier for LCD as claimed in claim 2, wherein the sampling voltage input terminal obtains a sampling voltage from the LCD, and the compensation voltage output terminal provides a reverse compensation voltage to the LCD.

7. The amplifier for LCD as claimed in claim 6, wherein the voltage at the inverting input terminal of the operational amplifier is within ±0.4V to limit ripples at the sampling voltage input terminal.

8. A liquid crystal display (LCD), comprising an amplifier, and the amplifier further comprising: an operational amplification module and an amplitude-limiting module serially connected to the operational amplification module;

wherein the operational amplification module comprises: an operational amplifier, a first resistor, a second resistor, a capacitor, a sampling voltage input terminal, a first reference voltage input terminal and a compensation voltage output terminal; the first resistor is connected between an inverting input terminal and an output terminal of the operational amplifier; the sampling voltage input terminal is connected to the inverting input terminal of the operational amplifier through the capacitor and the second resistor, which are sequentially connected, the first reference voltage input terminal is connected to a positive input terminal of the operational amplifier, and the compensation voltage output terminal is connected to the output terminal of the operational amplifier;

the amplitude-limiting module is connected serially between the capacitor and the second resistor, the amplitude-limiting module comprises a first Schottky diode and a second Schottky diode connected in parallel, and a second reference voltage input terminal connected between the first Schottky diode and the second Schottky diode; an anode of the first Schottky diode and a cathode of the second Schottky diode are both connected between the capacitor and the second resistor.

9. The LCD as claimed in claim 8, wherein the first reference voltage input terminal and the second reference voltage input terminal receive reference voltages from an external circuit, and the first reference voltage and the second reference voltage are equal.

10. The LCD as claimed in claim 9, wherein the sampling voltage input terminal obtains a sampling voltage from the LCD, and the compensation voltage output terminal provides a reverse compensation voltage to the LCD; the voltage at the inverting input terminal of the operational amplifier is within ±0.4V to limit ripples at the sampling voltage input terminal.

* * * * *